United States Patent [19]

Pelley, III et al.

[11] Patent Number: 4,806,799
[45] Date of Patent: Feb. 21, 1989

[54] ECL TO CMOS TRANSLATOR

[75] Inventors: Perry H. Pelley, III; Ruey J. Yu; Scott G. Nogle, all of Austin, Tex.

[73] Assignee: Motorola, Inc., Schaumburg, Ill.

[21] Appl. No.: 160,885

[22] Filed: Feb. 26, 1988

[51] Int. Cl.⁴ ................ H03K 19/092; H03K 19/086; H03K 19/003; H03K 17/10

[52] U.S. Cl. .................................. 307/475; 307/455; 307/355; 307/358

[58] Field of Search ............... 307/475, 454, 455, 456, 307/355, 356, 358, 362, 363, 264, 260, 443, 279, 247.1

[56] References Cited

U.S. PATENT DOCUMENTS

| | | | |
|---|---|---|---|
| 4,563,600 | 1/1986 | Kobayashi et al. | 307/475 X |
| 4,629,913 | 12/1986 | Lechner | 307/475 |
| 4,645,951 | 2/1987 | Uragami | 307/475 X |
| 4,684,831 | 8/1987 | Kruest | 307/475 |
| 4,767,951 | 8/1988 | Cornish et al. | 307/475 |

Primary Examiner—Stanley D. Miller
Assistant Examiner—David R. Bertelson
Attorney, Agent, or Firm—James L. Clingan, Jr.

[57] ABSTRACT

In integrated circuits which include both ECL and CMOS circuits, there is an ECL to CMOS translator which converts ECL logic levels to CMOS logic levels. To convert from ECL to CMOS levels, the ECL logic high is coupled to the base of an NPN transistor which provides a CMOS logic low. The ECL logic low is prevented from being coupled to the base of the NPN transistor. The CMOS logic high is obtained by an analogous second circuit which is responsive to a complementary ECL signal the output of which is coupled to a P channel transistor. The P channel transistor either provides the CMOS logic high output or is non-conductive.

18 Claims, 1 Drawing Sheet

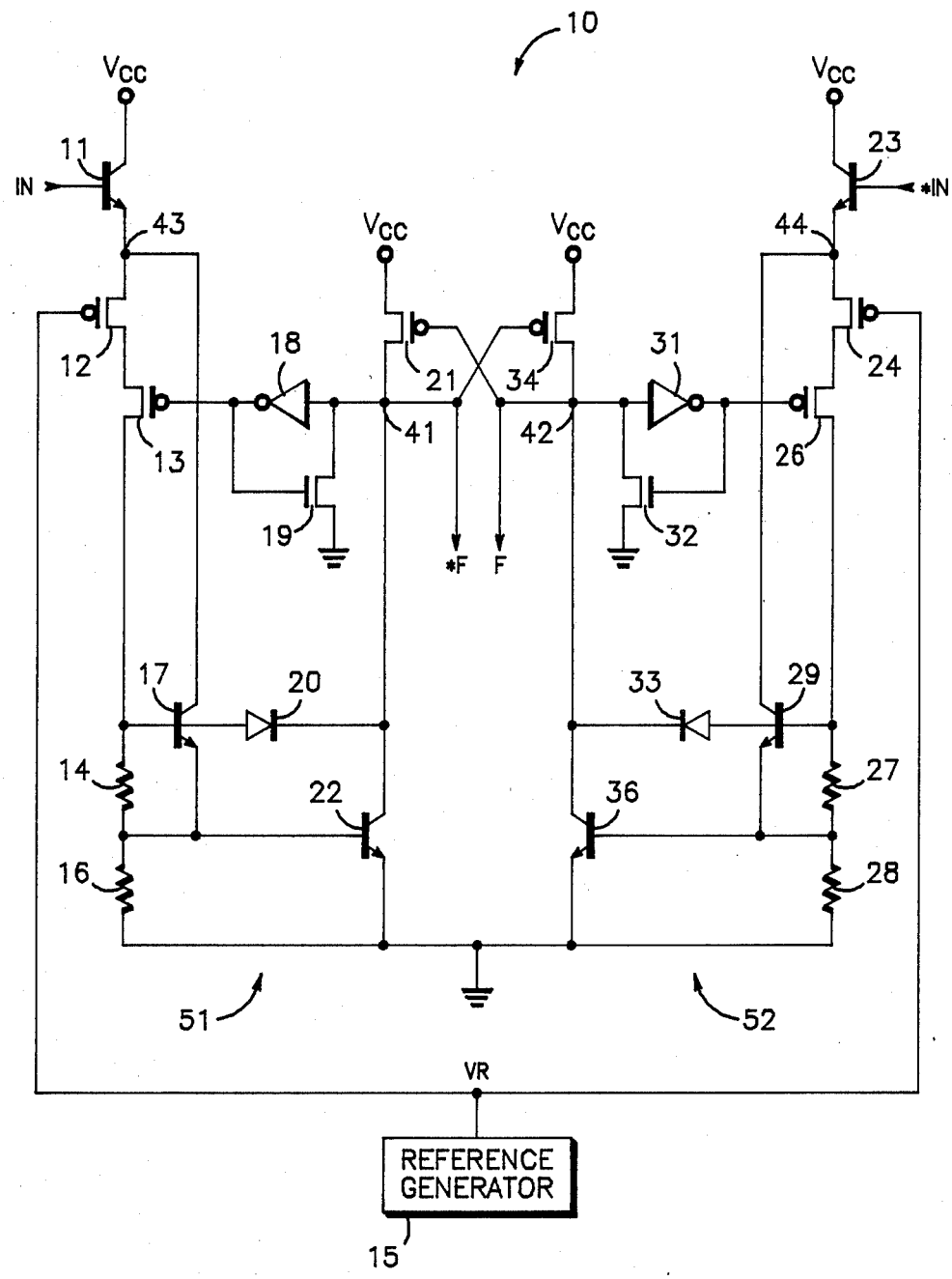

ECL TO CMOS TRANSLATOR

FIELD OF THE INVENTION

The present invention relates to BiMOS integrated circuits, and more particularly, to BiMOS integrated circuits which have an ECL circuit which outputs a signal to a CMOS circuit.

BACKGROUND OF THE INVENTION

Integrated circuit processing technology has been developed which allows for the formation of bipolar and MOS circuits on the same die (or chips). Bipolar and MOS circuits have different characteristics which can be used to complement each other. Bipolar circuits tend to be faster than MOS circuits whereas MOS circuits tend to consume less power than bipolar circuits. The low power of MOS allows for, among other things, more transistors on a chip. This is particularly advantageous in memories. Bipolar and MOS circuits have been combined on the same chip in static random access memories (SRAMs) for example.

In such a memory the bipolar circuits are used primarily in the peripheral circuitry for speed. Some of the peripheral circuits are CMOS. The memory array itself is MOS circuitry for density. The signals generated externally are received by bipolar circuitry and then internally provided to CMOS circuits. There must then be provided internally a circuit for making the transition from bipolar level signals to CMOS level signals.

In the case where emitter coupled logic (ECL) circuits are used as the bipolar circuits, there is a particular problem with level translation because ECL logic states vary only about one volt whereas CMOS logic states swing the full rail of the power supply voltage. The typical power supply voltage is about 5 volts. That the difference between a logic high and a logic low is only one volt in ECL is part of the reason that ECL circuits are so fast. On the other hand a part of the reason that CMOS is low power is because the logic levels swing the entire power supply voltage. One of the requirements then of an integrated circuit which combines the advantages of CMOS and ECL is that there be an ECL to CMOS translator which does not cause excessive delay. In the past this translation has been accomplished by having a P channel device receive the ECL signal. This has created problems because the P channel device must be made very large because the one volt logic state differential of ECL does not cause a very large gate to source voltage differential on the P channel transistor. The ECL transistors do not track the P channel transistors over process variations so there is also a problem in guaranteeing that the P channel transistor is non-conductive for the logic high output of the ECL circuit.

SUMMARY OF THE INVENTION

An object of the invention is to provide an improved ECL to CMOS translator.

This and other objects are provided in an integrated circuit having an ECL circuit for providing a first ECL output signal at a logic low at a voltage at least 2 volts above a voltage at a first power supply terminal and a logic high at a voltage greater than the voltage of the logic low and further having a translator circuit for providing a voltage at or near the potential at the first power supply terminal on an output node in response to the ECL output signal switching to the logic high. The translator circuit comprises a first NPN transistor, a control circuit, and a second transistor. The first NPN transistor has a base for receiving the first ECL output signal, a collector coupled to a second power supply terminal for receiving a voltage greater than the voltage present at the second power supply terminal, and an emitter. The control circuit couples the emitter of the first NPN transistor to an intermediate node in response to said ECL output signal switching to the logic high and prevents the emitter of the first NPN transistor from being coupled to the intermediate node when said ECL output signal is at the logic low. The second transistor has a control electrode coupled to the intermediate node, a first current electrode coupled to the first power supply terminal, and a second current electrode coupled to the output node. The output node is thus coupled to the first power supply terminal in response to the first ECL output signal switching to the logic high.

BRIEF DESCRIPTION OF THE DRAWINGS

The FIGURE is a combination circuit and block diagram of an ECL to CMOS translator according to a preferred embodiment of the invention.

DESCRIPTION OF THE INVENTION

Shown in the sole FIGURE is an ECL to CMOS translator 10 comprising an NPN transistor 11, a P channel transistor 12, a P channel transistor 13, a resistor 14, a reference generator 15 for generating a reference voltage VR, a resistor 16, an NPN transistor 17, an inverter 18, an N channel transistor 19, a diode 20, a P channel transistor 21, an NPN transistor 22, an NPN transistor 23, a P channel transistor 24, a P channel transistor 26, a resistor 27, a resistor 28, an NPN transistor 29, an inverter 31, an N channel transistor 32, a diode 33, a P channel transistor 34, and an NPN transistor 36.

Transistor 11 has a collector coupled to a positive power supply terminal VCC for receiving a positive power supply voltage of, for example, 5 volts, a base for receiving a true ECL input signal IN, and an emitter. Transistor 12 has a source connected to the emitter of transistor 11, a gate for receiving reference voltage VR from reference voltage generator 15, and a drain. Transistor 13 has a source connected to the drain of transistor 12, a gate, and a drain. Resistor 14 has a first terminal connected to the drain of transistor 13, and a second terminal. Resistor 16 has a first terminal connected to the second terminal of resistor 16, and a second terminal connected to ground. Transistor 17 has a base connected to the first terminal of resistor 14, a collector connected to the emitter of transistor 11, and an emitter connected to the second terminal of resistor 14. Inverter 18 has an input connected to an output node 41, and an output connected to the gate of transistor 13. Transistor 19 has a gate connected to the output of inverter 18, a drain connected to the input of inverter 18, and a source connected to ground. Diode 20 has an anode connected to the first terminal of resistor 14, and a cathode connected to node 41. Transistor 21 has source connected to VCC, a drain connected to node 41, and a gate connected to an output node 42. Transistor 22 has a collector connected to node 41, a base connected to the second terminal of resistor 14, and an emitter connected to ground.

Transistor 23 has a collector connected to VCC, a base for receiving a complementary ECL input signal

*IN, and an emitter. Transistor 24 has a source connected to the emitter of transistor 23, a gate for receiving reference voltage VR, and a drain. Transistor 26 has a source connected to the drain of transistor 24, a gate, and a drain. Resistor 27 has a first terminal connected to the drain of transistor 26, and a second terminal. Resistor 28 has a first terminal connected to the second terminal of resistor 27, and a second terminal connected to ground. Transistor 29 has a base connected to the first terminal of resistor 27, a collector connected to the emitter of transistor 23, and an emitter connected to the second terminal of resistor 27. Inverter 31 has an input connected to the output node 42, and an output connected to the gate of transistor 26. Transistor 32 has a gate connected to the output of inverter 31, a drain connected to the input of inverter 31, and a source connected to ground. Diode 33 has an anode connected to the first terminal of resistor 27, and a cathode connected to node 42. Transistor 34 has source connected to VCC, a drain connected to node 42, and a gate connected to an output node 41. Transistor 36 has a collector connected to node 42, a base connected to the second terminal of resistor 27, and an emitter connected to ground.

Translator 10 can be viewed as having a true responsive circuit 51 and a complementary responsive circuit 52. Circuit 51 receives true signal IN as an input, whereas circuit 52 receives complementary signal *IN as an input. Circuit 51 comprises transistors 11, 12, 13, 17, 19, 21, and 22; resistors 14 and 16; inverter 18; and diode 20. Circuit 52 comprises transistors 23, 24, 26, 29, 32, 34, and 36; resistors 27 and 28; inverter 31; and diode 33.

In operation signals IN and *IN are complementary signals generated by an ECL circuit. Nodes 41 and 42 are the nodes at which complementary signals *F and F, respectively, are generated as full rail signals and thus suitable for use by a CMOS circuit. The control of the voltage on the emitters of transistors 11 and 23, labelled nodes 43 and 44, respectively, is highly relevant to the operation of translator 10.

When signal IN is a logic high, transistor 11 drives node 43 to one base-emitter drop (Vbe) below the voltage of signal IN. Reference voltage VR is chosen so that transistor 12 is conductive when node 43 is one Vbe below the ECL logic high voltage. Assuming that output signal *F is going to have to change state in response to signal IN switching to a logic high, signal *F will then be assumed to be a logic high. With signal *F at a logic high, inverter 18 outputs a logic low to transistor 13 which causes transistors 13 to be conductive. With transistors 12 and 13 conductive, current flows through transistors 12 and 13 and resistors 14 and 16 which causes a voltage drop across resistors 14 and 16 and a rise in voltage on the base of transistor 22 until transistor 22 becomes conductive. Transistor 22 becoming conductive causes node 41 to be reduced in voltage. The rise in voltage on resistors 14 and 16 also causes transistor 17 to conduct passing even more current to the base on transistor 22 which causes transistor 22 to even more rapidly reduce the voltage at node 41. As node 41 reduces in voltage, inverter 18 responds by outputting a logic high which causes transistor 13 to become non-conductive. As transistor 13 becomes non-conductive, current stops flowing through resistors 14 and 16 to reduce the voltage on the bases of transistors 17 and 22 until transistors 17 and 22 become non-conductive. Diode 20 also prevents transistor 22 from becoming saturated when transistor 22 is conductive and speeds up how fast transistors 17 and 22 become completely non-conductive. Transistor 19 pulls node 41 to ground and ensures that node 41 is held at a logic low after transistor 22 has become non-conductive. The logic low on node 41 causes transistor 34 to become conductive and drive node 42 to a logic high. Thus circuit 51 responds to signal IN switching to a logic high by switching signal *F to a logic low which causes signal F to switch to a logic high.

For the case in which signal IN switches to a logic low from a logic high, the initial condition of node 43 is one Vbe below the logic high state of signal IN so that transistor 12 is conductive. Transistor 13 is non-conductive because inverter 18 outputs a logic high in response to the logic low of signal *F. When signal IN does switch to a logic low, node 43 will initially drop slightly in voltage due to base-emitter capacitance of transistor 11 but there is otherwise initially no response to signal IN switching to a logic low. Signal *F is switched to a logic high in response to circuit 52 switching signal F to a logic low in response to signal *IN switching to a logic high. As complementary signals, if signal IN switches to a logic low, then it is known that signal *IN will switch to a logic high. Circuit 52 operates to provide signal F at a logic low in response to signal *IN switching to a logic high in the same manner as described for circuit 51 providing signal *F at a logic low in response to signal IN switching to a logic high. Signal F switching to a logic low causes transistor 21 to become conductive which causes node 41 to rise in voltage. Transistor 21 is quite large in gain compared to that of transistor 19, which is merely a keeper device, so that transistor 21 easily overdrives transistor 19 to drive node 41 higher in voltage so that signal *F becomes a logic high. As node 41 rises in voltage, inverter 18 responds by outputting a logic low which causes transistor 13 to become conductive. With transistors 12 and 13 conductive, node 43 is reduced in voltage until transistor 12 becomes non-conductive. Transistor 12 will become non-conductive when node 43 is reduced to one P channel threshold voltage above reference voltage VR. Transistor 11 is non-conductive so that the voltage at node 43 is maintained because of capacitance of the source of transistor 12, the emitter of transistor 11, and the collector of transistor 17. Thus the amount of charge drawn from node 43 to reduce the voltage on node 43 to one P channel threshold voltage is very small and the time required to reduce the voltage on node 43 to one P channel threshold voltage is very small. Thus transistors 17 and 22 do not provide any reaction of consequence to transistor 13 becoming conductive in response to signal *F switching to a logic high.

Transistor 13 being conductive in response to signal *F being a logic high is significant in the operation of circuit 51. Transistor 13 being conductive is then an initial condition for the case in which signal IN switches to a logic high. Thus when signal IN switches to a logic high, the consequent rise in voltage of node 43 is immediately coupled to the bases of transistors 17 and 22 so that signal *F switches to a logic low with minimal delay. Additionally, the current paths are terminated after signal *F has switched to the logic low so that there are no d.c. paths between Vcc and ground after the logic states of signals F and *F have been established. Especially for rapid cycle times between changes in signals IN and *IN, node 43 remains very near the logic high voltage even when signal IN is a logic low. Thus node 43 need only be raised slightly in voltage in response to signal IN switching to a logic high. This also is advantageous for speed. Node 43 can only drop in voltage one Vbe below the ECL logic low. Transistor 11 becomes conductive to prevent any drop below one Vbe below the logic low of signal IN.

Reference voltage VR is chosen to ensure that transistor 12 is not conductive for the case when transistor 11 can be conductive with a logic low input but is conductive for the case in which signal IN is a logic high. Transistor 11 is not conductive until node 43 drops to one Vbe below the base of transistor 11. Thus, for the case in which signal IN is a logic low, transistor 13 can be prevented from becoming conductive simultaneously with transistor 11 becoming conductive by selecting reference voltage VR to be greater than one P channel threshold voltage below one Vbe below the ECL logic low. The voltage on node 43 is then not sufficiently greater than the voltage at the gate of transistor 12 for transistor 12 to become conductive when signal IN is an ECL logic low. On the other hand transistor 12 must be conductive for the case in which signal IN is an ECL logic high. Node 43 is one Vbe below the ECL logic high when signal IN is a logic high. Consequently, reference voltage VR must be less than one P channel threshold voltage below one Vbe below the ECL logic high. Because there is about a one volt difference between an ECL logic high and an ECL logic low, reference voltage VR is chosen to be a few tenths of a volt below one P channel threshold voltage below one Vbe below the ECL logic high voltage. The ECL logic high voltage, a Vbe, and a P channel threshold voltage are all references readily available in the particular integrated circuit so that reference generator 15 providing reference VR within the desired constraints is easily attainable using bandgap reference techniques.

Thus, it will be apparent to those skilled in the art that the disclosed invention may be modified in numerous ways and may assume many embodiments other than those specifically set out and described above. For example, the voltage on the gate of transistor could be clocked instead of being a constant reference voltage so long as transistor 12 was non-conductive when signal IN was a logic low and was conductive when signal IN was a logic high. An advantage of clocking the gate of transistor 12 would be that transistor 12 could be more conductive when signal IN was a logic high. A disadvantage is increased circuit complexity. Another example of a possible variation is to use PNP transistors in place of P channel transistors 12 and 24. Accordingly, it is intended by the appended claims to cover all modifications of the invention which fall within the true spirit and scope of the invention.

We claim:

1. An ECL to CMOS translator for receiving first and second complementary ECL input signals and providing a first output signal at CMOS levels, comprising:

first control means for coupling the first ECL input signal to a first node if said first ECL input signal is in a first logic state and for preventing said first ECL input signal from being coupled to the first node if said first ECL input signal is in a second logic state;

first coupling means, coupled to a second node and the first control means, for coupling the first node to a third node in response to the second node being at the first logic state;

a first transistor having a control electrode coupled to the third node, a first current electrode coupled to a first power supply terminal, and a second current electrode coupled to the second node, said first transistor for providing said first output signal on said second node at the second logic state in response to the third node receiving said first ECL input signal at said first logic state;

second control means for coupling the second ECL input signal to a fourth node if said second ECL input signal is in a first logic state and for preventing said second ECL input signal from being coupled to the fourth node if said second ECL input signal is in a second logic state;

second coupling means, coupled to a fifth node and the second control means, for coupling the fourth node to a sixth node in response to the fifth node being at the first logic state;

a second transistor having a control electrode coupled to the sixth node, a first current electrode coupled to the first power supply terminal, and a second current electrode coupled to the fifth node; and a third transistor having a control electrode coupled to the fifth node, a first current electrode coupled to a second power supply terminal, and a second current electrode coupled to the second node, said third transistor providing said output signal at the second logic state on said second node in response to receiving the first logic state on said fifth node.

2. The translator of claim 1 further comprising:
a fourth transistor having a control electrode coupled to the second node, a first current electrode coupled to the second power supply terminal, and a second current electrode coupled to the fifth node.

3. The translator of claim 2, wherein the first and second transistors are NPN transistors.

4. The translator of claim 3, wherein the third and fourth transistors are P channel transistors.

5. In an integrated circuit having an ECL circuit for providing a first ECL output signal at a logic low at a voltage at least 2 volts above a voltage at a first power supply terminal and a logic high at a voltage greater than the voltage of the logic low, a translator circuit for providing a voltage at or near the potential at the first power supply terminal on an output node in response to the ECL output signal switching to the logic high, comprising:

a first NPN transistor having a base for receiving the first ECL output signal, a collector coupled to a second power supply terminal for receiving a voltage greater than the voltage present at the second power supply terminal, and an emitter;

first control means for coupling the emitter of the first NPN transistor to an intermediate node in response to said first ECL output signal switching to the logic high and for preventing said emitter of the first NPN transistor from being coupled to the intermediate node when said first ECL output signal is at the logic low; and a second transistor having a control electrode coupled to the intermediate node, a first current electrode coupled to the first power supply terminal, and a second current electrode coupled to the output node, whereby the output node is coupled to the first power supply terminal in response to the first ECL output signal switching to the logic high.

6. The translator circuit of claim 5 further comprising decoupling means, interposed between the intermediate node and the control electrode of the first NPN transistor, for decoupling the intermediate node from the control electrode of the second transistor in response to the output node switching to the voltage at or near the voltage at the first power supply terminal.

7. The translator circuit of claim 5 wherein the control means is a P channel transistor having a first current electrode coupled to the emitter of the first NPN transistor, a control electrode for receiving a reference voltage, and a second current electrode coupled to the intermediate node.

8. The translator circuit of claim 7 wherein the first NPN transistor is characterized as having Vbe and the P channel transistor is characterized as having a P channel threshold voltage, and the control means further comprises reference generator means for generating the reference voltage at a voltage greater than one Vbe below the P channel threshold voltage below the voltage of the logic low of the first ECL output signal and less than one Vbe below the P channel threshold voltage below the voltage of the logic high of the first ECL output signal.

9. The translator circuit of claim 5 further comprising logic high means for receiving a second ECL output signal complementary to the first ECL output signal and coupling the second power supply terminal to the output node in response to said second ECL output signal switching to the logic high.

10. In an integrated circuit having an ECL switching for providing a first ECL output signal at a logic low at least 2 volts above a potential at a first power supply terminal and a logic high at a voltage greater than the voltage of the logic low, a translator circuit for providing a voltage at or near the potential at the first power supply terminal on an output node in response to the ECL output signal switching to the logic high, comprising:
   a first NPN transistor having a base for receiving the first ECL output signal, a collector coupled to a second power supply terminal for receiving a voltage greater than the voltage present at the second power supply terminal, and an emitter;
   a first P channel transistor having a first current electrode coupled to the emitter of the first NPN transistor, a control electrode for receiving a reference voltage, and a second current electrode;
   a second P channel transistor having a first current electrode coupled to the second current electrode of the first P channel transistor, a control electrode, and a second current electrode;
   a first resistor having a first terminal coupled to the second current electrode of the second P channel transistor, and a second terminal;
   a second NPN transistor having a base coupled to the second terminal of the first resistor, an emitter coupled to the first power supply terminal, and a collector coupled to the output node;
   an inverter having an input coupled to the output node, and an output coupled to the control electrode of the second P channel transistor.

11. The translator circuit of claim 10 wherein the first NPN transistor is characterized as having Vbe and the second P channel transistor is characterized as having a P channel threshold voltage, and the control means further comprises reference generator means for generating the reference voltage at a voltage greater than one Vbe below the P channel threshold voltage below the voltage of the logic low of the first ECL output signal and less than one Vbe below the P channel threshold voltage below the voltage of the logic high of the first ECL output signal.

12. The transistor circuit of claim 10 further comprising a second resistor having a first terminal coupled to the base of the second NPN transistor, a second terminal coupled to the first power supply terminal.

13. The transistor circuit of claim 12 further comprising a third NPN transistor having a base coupled to the first terminal of the first resistor, a collector coupled to the emitter of the first NPN transistor, and an emitter coupled to the base of the second NPN transistor.

14. The translator circuit of claim 13 further comprising a first N channel transistor having a control electrode coupled to the output of the inverter, a first current electrode coupled to the output of the inverter, and a second current electrode coupled to the first power supply terminal.

15. The translator circuit of claim 14 further comprising a diode having an anode coupled to the first terminal of the first resistor, and a cathode coupled to the collector of the second NPN transistor.

16. The translator circuit of claim 10 for further providing a voltage at or near the second power supply terminal on the output node in response to a complementary ECL signal, further comprising:
   a third NPN transistor having a base for receiving the complementary ECL signal, a collector coupled to a second power supply terminal, and an emitter;
   a third P channel transistor having a first current electrode coupled to the emitter of the third NPN transistor, a control electrode for receiving the reference voltage, and a second current electrode;
   a fourth P channel transistor having a first current electrode coupled to the second current electrode of the third P channel transistor, a control electrode, and a second current electrode;
   a second resistor having a first terminal coupled to the second current electrode of the fourth P channel transistor, and a second terminal;
   a fourth NPN transistor having a base coupled to the second terminal of the second resistor, an emitter coupled to the first power supply terminal, and a collector coupled to a control node;
   a second inverter having an input coupled to the control node, and an output coupled to the control electrode of the fourth P channel transistor; and
   a fifth P channel transistor having a first current electrode coupled to the second power supply terminal, a control electrode coupled to the control node, and a second current electrode coupled to the output node.

17. The translator circuit of claim 16 further comprising a sixth P channel transistor having a first current electrode coupled to the second power supply terminal, a control electrode coupled to the output node, and a second current electrode coupled to the control node.

18. The translator circuit of claim 17 wherein the first NPN transistor is characterized as having a Vbe and the first P channel transistor is characterized as having a P channel threshold voltage, and the control means further comprises reference generator means for generating the reference voltage at a voltage greater than one Vbe below the P channel threshold voltage below the voltage of the logic low of the first ECL output signal and less than one Vbe below the P channel threshold voltage below the voltage of the logic high of the first ECL output signal.

* * * * *

UNITED STATES PATENT AND TRADEMARK OFFICE
CERTIFICATE OF CORRECTION

PATENT NO. : 4,806,799

DATED : February 21, 1989

INVENTOR(S) : Perry H. Pelley, III, et al

It is certified that error appears in the above-identified patent and that said Letters Patent is hereby corrected as shown below:

Column 7, line 30, change "switching" to --circuit--.

Column 7, line 58, change "tothe" to --to the--.

Column 7, line 62, insert --a-- between "having" and "Vbe".

Signed and Sealed this

First Day of August, 1989

Attest:

DONALD J. QUIGG

Attesting Officer    Commissioner of Patents and Trademarks

REEXAMINATION CERTIFICATE (1771st)

United States Patent [19]

Pelley, III et al.

[11] B1 4,806,799

[45] Certificate Issued  Aug. 18, 1992

[54] ECL TO CMOS TRANSLATOR

[75] Inventors: Perry H. Pelley, III; Ruey J. Yu; Scott G. Nogle, all of Austin, Tex.

[73] Assignee: Motorola, Inc.

Reexamination Request:
No. 90/002,550, Feb. 11, 1992

Reexamination Certificate for:
Patent No.: 4,806,799
Issued: Feb. 21, 1989
Appl. No.: 160,885
Filed: Feb. 26, 1988

[51] Int. Cl.⁵ ............... H03K 19/092; H03K 19/086; H03K 19/003; H03K 17/10
[52] U.S. Cl. ................................ 307/475; 307/355; 307/358; 307/455
[58] Field of Search ............... 307/475, 264, 355, 358, 307/455

[56] References Cited

U.S. PATENT DOCUMENTS

| | | | |
|---|---|---|---|
| 4,563,600 | 1/1986 | Kobayashi et al. | 307/455 |
| 4,629,913 | 12/1986 | Lechner | 307/475 |
| 4,645,951 | 2/1987 | Urgami | 307/446 |
| 4,684,831 | 8/1987 | Kruest | 307/475 |
| 4,767,951 | 8/1988 | Cornish et al. | 307/475 |

*Primary Examiner*—J. Zazworsky

[57] ABSTRACT

In integrated circuits which include both ECL and CMOS circuits, there is an ECL to CMOS translator which converts ECL logic levels to CMOS logic levels. To convert from ECL to CMOS levels, the ECL logic high is coupled to the base of an NPN transistor which provides a CMOS logic low. The ECL logic low is prevented from being coupled to the base of the NPN transistor. The CMOS logic high is obtained by an analogous second circuit which is responsive to a complementary ECL signal the output of which is coupled to a P channel transistor. The P channel transistor either provides the CMOS logic high output or is non-conductive.

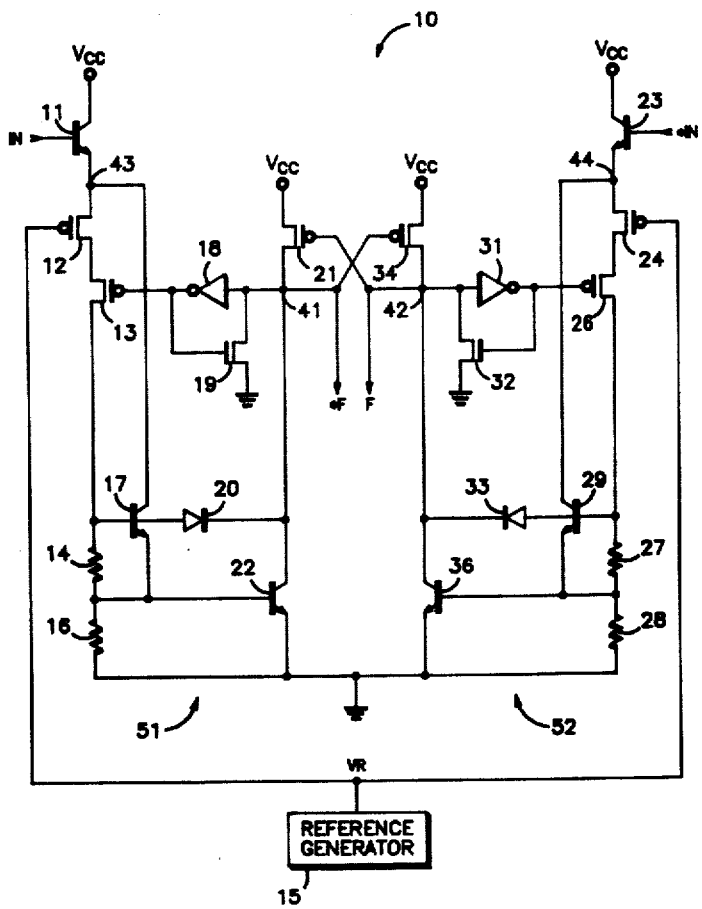

REEXAMINATION CERTIFICATE ISSUED UNDER 35 U.S.C. 307

NO AMENDMENTS HAVE BEEN MADE TO THE PATENT

AS A RESULT OF REEXAMINATION, IT HAS BEEN DETERMINED THAT:

The patentability of claims 1-18 is confirmed.

* * * * *